United States Patent
Miyo et al.

(10) Patent No.: US 6,819,610 B2
(45) Date of Patent: Nov. 16, 2004

(54) DRAM OPERATING LIKE SRAM

(75) Inventors: Toshiya Miyo, Kawasaki (JP); Toshikazu Nakamura, Kawasaki (JP); Satoshi Eto, Kawasaki (JP); Ayako Sato, Kawasaki (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 127 days.

(21) Appl. No.: 10/267,873

(22) Filed: Oct. 10, 2002

(65) Prior Publication Data

US 2003/0146950 A1 Aug. 7, 2003

(30) Foreign Application Priority Data

Feb. 7, 2002 (JP) ........................................ 2002-031090

(51) Int. Cl.[7] ................................................ G11C 7/00
(52) U.S. Cl. ..................... 365/203; 365/233; 365/233.5
(58) Field of Search ............................. 365/203, 233.5, 365/233

(56) References Cited

U.S. PATENT DOCUMENTS

| | | | | |
|---|---|---|---|---|
| 5,091,889 A | * | 2/1992 | Hamano et al. | 365/233.5 |
| 5,339,274 A | * | 8/1994 | Dhong et al. | 365/203 |
| 6,442,088 B1 | * | 8/2002 | Tsuchida et al. | 365/203 |

* cited by examiner

*Primary Examiner*—Son T. Dinh
(74) *Attorney, Agent, or Firm*—Arent Fox PLLC

(57) ABSTRACT

A semiconductor memory device includes a first bit line connected to a memory cell via a transistor, a transfer gate, a second bit line connected to the first bit line via the transfer gate, a sense amplifier connected to the second bit line, a first precharge circuit for precharging the first bit line, a second precharge circuit for precharging the second bit line, a control circuit which precharges the first bit line by the first precharge circuit after closing the transfer gate, followed by subsequent precharging of the second bit line by the second precharge circuit.

8 Claims, 10 Drawing Sheets

US 6,819,610 B2

DRAM OPERATING LIKE SRAM

BACKGROUND OF THE INVENTION

1. Field of the Invention

The present invention generally relates to semiconductor memory devices, and particularly relates to a semiconductor memory device which performs precharge operations.

2. Description of the Related Art

Certain types of electrical equipment such as cellular phones have conventionally used SRAMs (static random access memories) as memories. SRAMs tend to have a low circuit density, so that an increase in the memory volume will result in a substantial cost increase. DRAMs (dynamic random access memory), on the other hand, are suitable for the implementation of a large memory volume at low costs. In order to take advantage of the past accumulation of SRAM-based configurations, it is desirable to provide a DRAM that is equipped with an interface equivalent to that of an SRAM.

It is necessary to periodically refresh data stored in the DRAM memory cells whereas there is no need for a refresh operation in SRAMs. In order to provide a DRAM acting like an SRAM that has no need for refreshing, refresh operations need to be automatically performed at proper timing in such a manner that can conceal the refresh operations from the exterior of the device.

Pairs of bit lines are precharged to Vcc/2. When a word line is activated at the time of a read operation, pairs of bit lines connected to relevant memory cells produces a potential difference, which is amplified by sense amplifiers for data retrieval. After the passage of a time period preset by internal circuitry, the word line is deactivated, and an auto-precharge is performed to bring the pairs of bit lines to the Vcc/2 level. With this, the read operation comes to an end.

In the SRAM-like DRAMs, bit lines are set to the precharge potential Vcc/2 immediately after a write operation or a read operation, thereby suppressing a leak of electric charge to a minimum level where such leak occurs between memory cells and bit lines. This improves refresh characteristics.

In the SRAM-like DARMs as described above, an auto-precharge is performed at the time of a data read operation, so that the pairs of bit lines of sense amplifiers are automatically set to the Vcc/2 level after the read operation. Because of this, there is a need to newly activate a word line for each data access even when successive accesses are directed to column addresses on the same word line. As a result, high-speed data retrieval such as that of a conventional DRAM page mode cannot be achieved when accesses are directed to the same word line.

Accordingly, there is a need for a DRAM that is provided with an auto-precharge function so as to act like an SRAM, and allows data to be read with a page mode and a burst mode.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor memory device including a first bit line connected to a memory cell via a transistor, a transfer gate, a second bit line connected to the first bit line via the transfer gate, a sense amplifier connected to the second bit line, a first precharge circuit for precharging the first bit line, a second precharge circuit for precharging the second bit line, a control circuit which precharges the first bit line by the first precharge circuit after closing the transfer gate, followed by subsequent precharging of the second bit line by the second precharge circuit.

In the semiconductor memory device as described above, the first precharge circuit for precharging the first bit lines of the memory cell portion and the second precharge circuit for precharging the second bit lines of a sense amplifier portion are provided separately. With this provision, the bit lines of the sense amplifier portion can be precharged by the second precharge circuit after the bit lines of the memory cell portion are precharged by the first precharge circuit with the transfer gate having been closed. During the time period preceding the precharging of the bit lines of the sense amplifier portion, the sense amplifiers still maintain their data stored therein, so that the data can be successively read from different column addresses on the same row address with a page mode operation or a burst mode operation.

Further, when the bit lines of the sense amplifier portion are to be precharged, the bit lines of the memory cell portion having a large parasitic capacitance have been already auto-precharged, so that only the bit lines of the sense amplifier portion need to be precharged by deactivating the sense amplifiers. It is thus possible to carry out a high-speed precharge operation and promptly switch to a next read or write operation.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
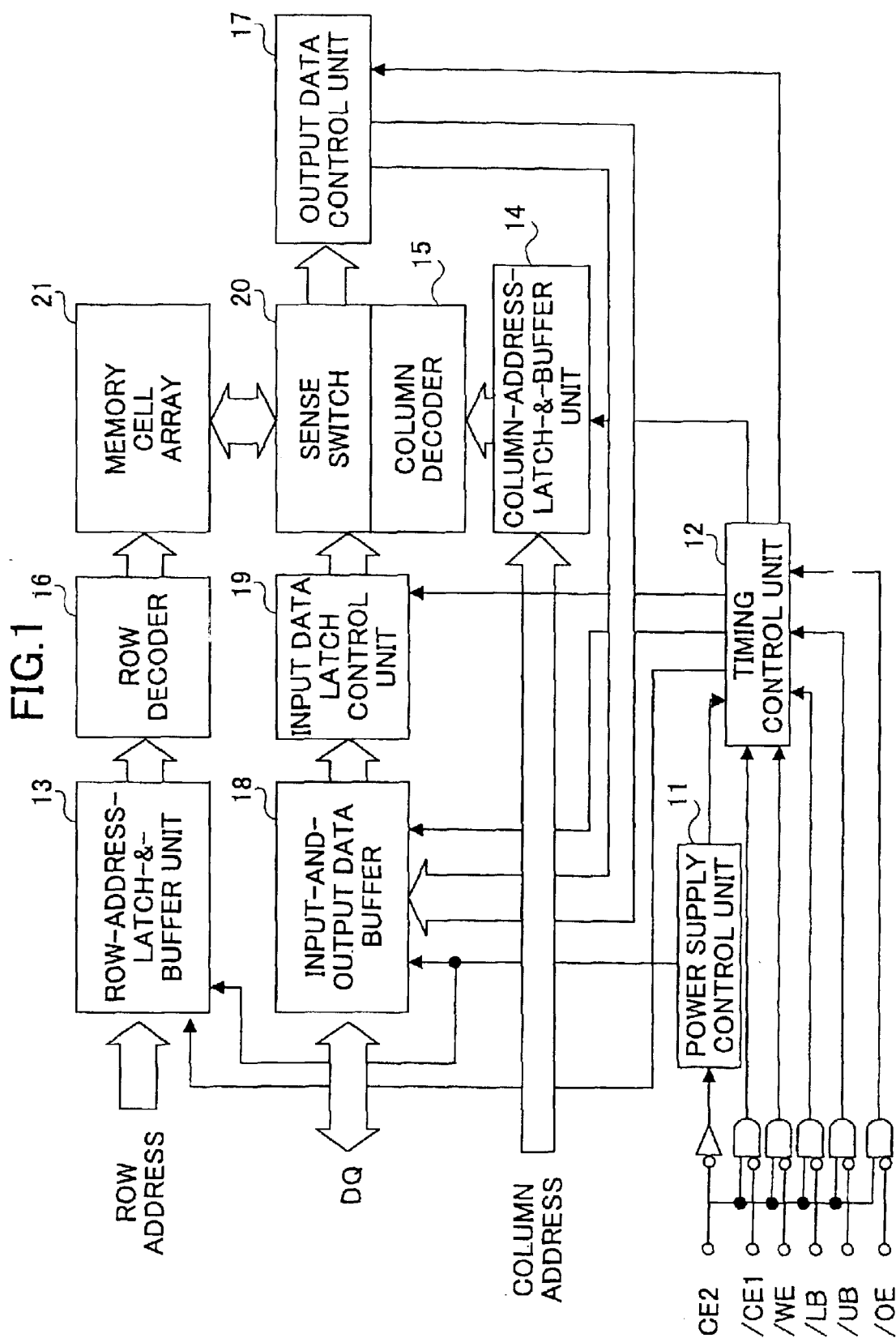
FIG. 1 is a block diagram of a semiconductor memory device according to the present invention.

FIG. 1 is a block diagram of a semiconductor memory device according to the present invention.

The semiconductor memory devices of FIG. 1 includes a power supply control unit 11, a timing control unit 12, a row-address-latch-&-buffer unit 13, a column-address-latch-&-buffer unit 14, a column decoder 15, a row decoder 16, an output data control unit 17, an input-and-output data buffer 18, an input data latch control unit 19, a sense switch 20, and a memory cell array 21.

The power supply control unit 11 controls a power-supply potential that is internally generated from an exterior power supply. The timing control unit 12 operates in response to control signals CE2, /CE1, /WE, /OE, and so on supplied from the exterior of the device so as to control circuit units in synchronization with clocks. The row-address-latch-&-buffer unit 13 latches and buffers a row address supplied from the exterior of the device, and supplies the buffered row address to the row decoder 16. The column-address-latch-&-buffer unit 14 latches and buffers a column address supplied from the exterior of the device, and supplies the buffered column address to the column decoder 15.

The column decoder 15 decodes the column address supplied from the column-address-latch-&-buffer unit 14, and activates a column selection line indicated by the column address. The row decoder 16 decodes the row address supplied from the row-address-latch-&-buffer unit 13, and activates a word line indicated by the row address. Data of memory cells connected to the activated word line are read to bit lines, and are then amplified by sense amplifiers. In the case of a read operation, the data amplified by the sense amplifiers are selected by the activated column selection line to be supplied to the exterior of the device via the output data control unit 17 and the input-and-output data buffer 18. In the case of a write operation, data are supplied from the exterior of the device through the input-and-output data buffer 18 and the input data latch control unit 19, and are written to sense amplifiers at the column address specified by the activated column selection line. The written data are then written to memory cells connected to the activated word line, while other data that were read from memory cells and to be restored to the memory cells are also written to memory cells at the same time. The word lines, bit lines, sense amplifiers, and so on are provided in the memory cell array 21.

The sense switch 20 switches data-transfer paths in such a manner as to supply data to be written to the memory cell array 21 from the input data latch control unit 19 at the time of a write operation, and to supply retrieved data from the memory cell array 21 to the output data control unit 17 at the time of a read operation. The data output operation by the output data control unit 17 is controlled by the timing control unit 12 in response to the output enable signal /OE.

The input data latch control unit 19 includes an input data latch for storage of data to be written. In the SRAM-like DRAM, when an address transition is detected with respect to addresses supplied from the exterior of the device during a read operation, a core operation is performed with respect to a post-transition address to retrieve data from the memory cell array 21. In the case of a write operation, when an address transition is detected with respect to addresses supplied from the exterior of the device, a core operation is performed based on a post-transition address, with an actual write operation being performed at a next write cycle. This is because the actual write operation for writing the data of the input data latch to the memory cell array 21 needs to be delayed until the address is fixed. Through such operations, the SRAM-line DRAM provides an interface equivalent to that of an SRAM. If a read operation is carried out following the write operation without any address change, the sense switch 20 is controlled such as to retrieve data from the input data latch rather than from the memory cell array 21 because the data has not yet been written to the memory cell array 21 but still remains in the input data latch.

Figure 2:
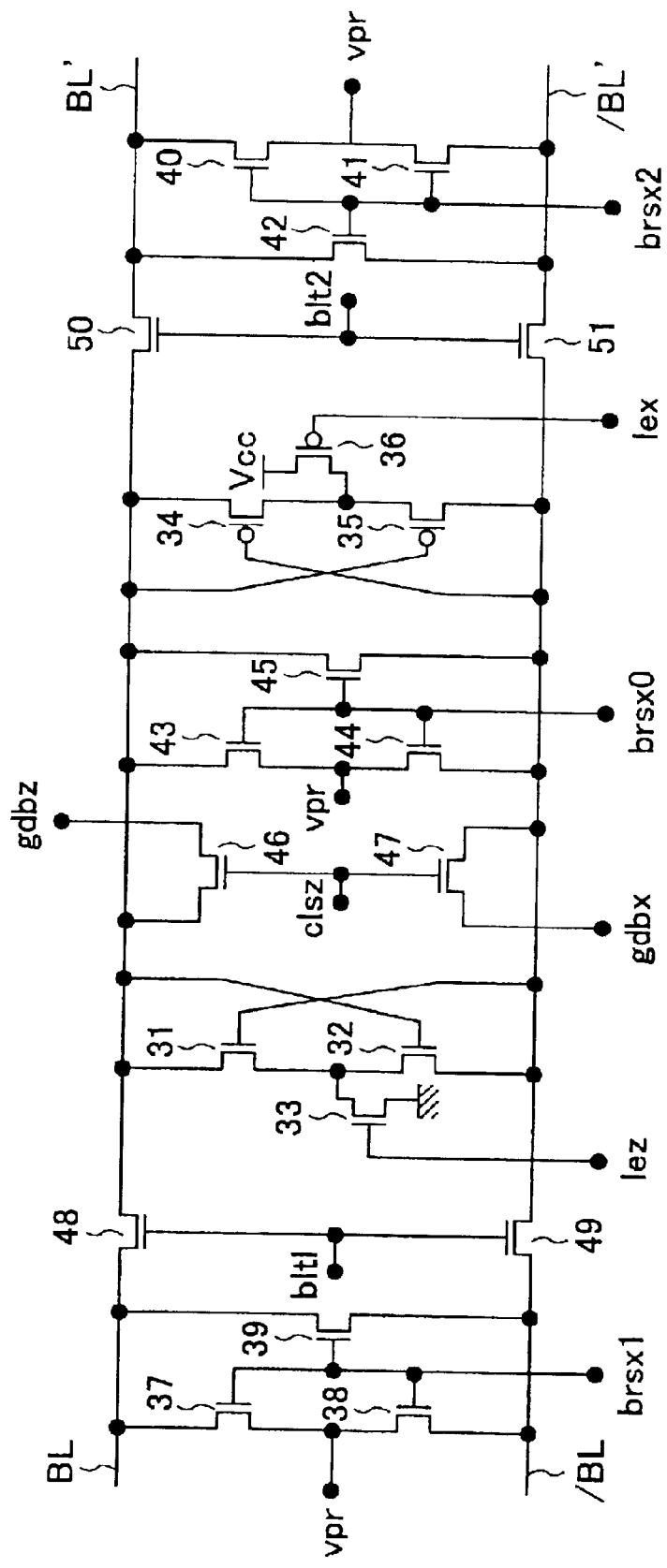
FIG. 2 is a circuit diagram showing a circuit surrounding a sense amplifier according to the present invention.

FIG. 2 is a circuit diagram showing a circuit surrounding a sense amplifier according to the present invention.

The circuit of FIG. 2 includes NMOS transistors 31 through 33, PMOS transistors 34 through 36, and NMOS transistors 37 through 51.

The NMOS transistors 31 through 33 and the PMOS transistors 34 through 36 together constitute a sense amplifier, which amplifies a potential difference between the bit lines BL and /BL or the bit lines BL' and /BL', thereby retrieving data conveyed to the bit lines. With a column selection line clsz being set to HIGH, the retrieved data are read as data gdbz and gdbx on the global data lines via the NMOS transistors 46 and 47. Alternatively, the column selection line clsz is set to HIGH so as to transfer data gdbz and gdbx from the global data lines to the bit lines via the NMOS transistors 46 and 47. Here, sense-amplifier driving signals lez and lex serve to drive the sense amplifier by coupling the sense amplifier to the power supply potential and to the ground potential.

The NMOS transistors 48 and 49 control coupling/decoupling between the sense amplifier and the bit lines BL and /BL. The NMOS transistors 50 and 51 control coupling/decoupling between the sense amplifier and the bit lines BL' and /BL'. When the NMOS transistors 48 and 49 are turned on by a transfer control signal blt1, the bit lines BL and /BL are coupled to the sense amplifier. Alternatively, a transfer control signal blt2 makes the NMOS transistors 50 and 51 conductive, thereby coupling the bit lines BL' and /BL' to the sense amplifier.

In response to a change to HIGH of a precharge signal brsx0, the NMOS transistors 43 through 45 precharge the bit lines of the sense amplifier to a potential vpr, and equalize potentials between the bit lines. In response to a change to HIGH of a precharge signal brsx1, the NMOS transistors 37 through 39 precharge the bit lines BL and /BL to the potential vpr, and equalize potentials between the bit lines. By the same token, responding to a change to HIGH of a precharge signal brsx2, the NMOS transistors 40 through 42 precharge the bit lines BL' and /BL' to the potential vpr, and equalize potentials between the bit lines.

The present invention is provided with the precharge circuit for the bit lines BL and /BL that is comprised of the NMOS transistors 37 through 39, and is also provided with the precharge circuit for the bit lines BL' and /BL' that is comprised of the NMOS transistors 40 through 42. With this provision, a precharge operation for the bit lines BL and /BL and a precharge operation for the bit lines BL' and /BL' can be carried out independently of the precharge operation for the sense amplifier portion.

Figure 3:
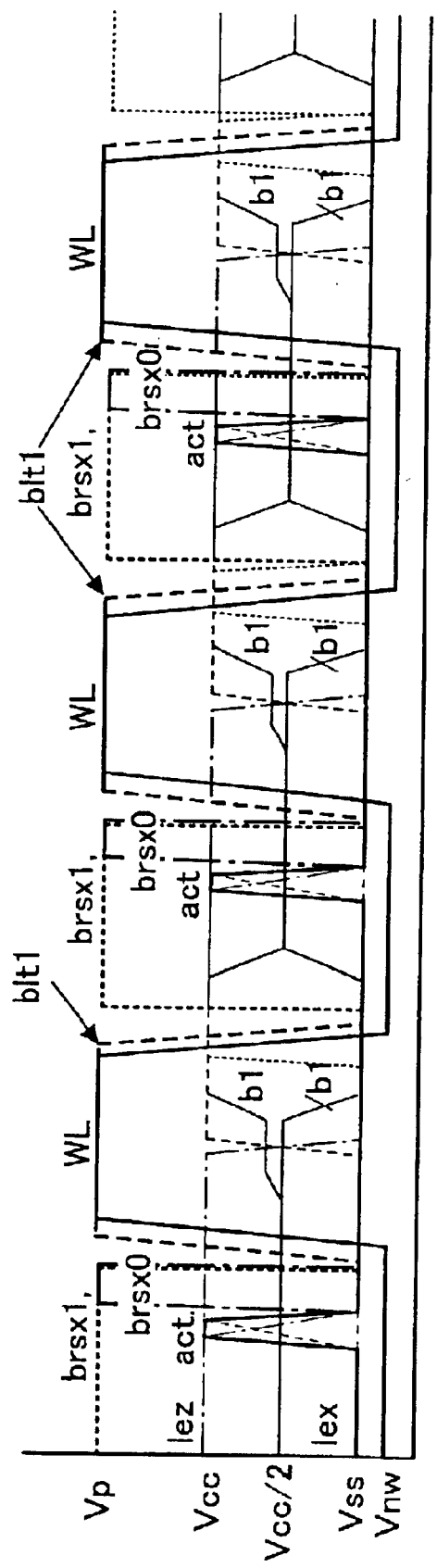
FIG. 3 is a signal time chart for explaining the operation of the circuit of FIG. 2.
Figure 4:
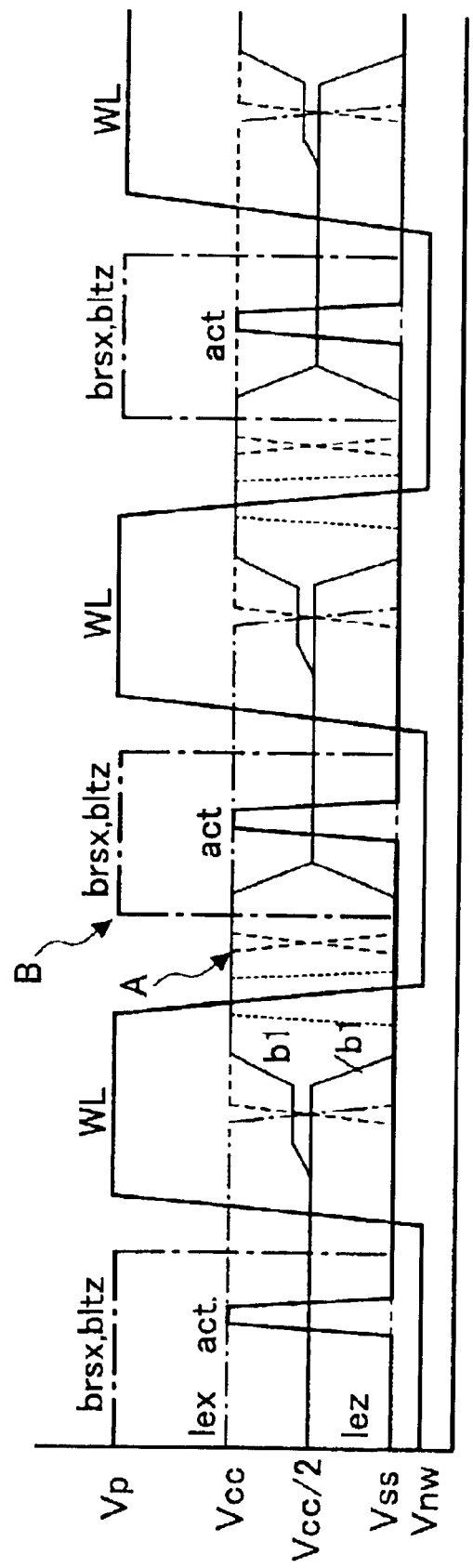
FIG. 4 is a signal time chart showing the operation of a conventional DRAM core provided with an auto-precharge function.

FIG. 3 is a signal time chart for explaining the operation of the circuit of FIG. 2. FIG. 4 is a signal time chart showing the operation of a conventional DRAM core provided with an auto-precharge function.

In FIG. 3, the precharge signal brsx1 is changed to HIGH (i.e., a boosted potential Vp), so that the bit lines BL and /BL are precharged to the potential vpr (=Vcc/2). Thereafter, an active signal act indicative of the start of operation is changed to HIGH to indicate the commencement of operation. In response, the sense-amplifier driving signals lez and lex are set to LOW and HIGH, respectively, to place the sense amplifier in an inactive state. Further, the precharge signal brsx0 is set to HIGH (i.e., the boosted potential Vp), so that the bit lines of the sense amplifier portion are precharged to the potential vpr (=Vcc/2). During the period described above, the transfer control signal blt1 is LOW, thereby severing the bit lines BL and /BL from the sense amplifier.

After this, the transfer control signal blt1 is raised to HIGH so as to couple the bit lines BL and /BL to the sense amplifier. A word-line selection signal WL is changed to HIGH, thereby coupling the memory cells of the selected row address to the bit lines BL and /BL. This results in the data of the memory cells being retrieved to the bit lines BL and /BL, so that bit-line potentials bl and /bl change from the precharge potential Vcc/2. The sense-amplifier driving signals lez and lex are then set to HIGH and LOW, respectively, thereby driving the sense amplifier to amplify the bit-line potentials bl and /bl. While the bit-line potentials bl and /bl are being amplified, access to the bit lines is made through column selection. In the case of a read operation, for example, the data of the amplified bit-line potentials bl and /bl is read through the column selection.

Then, the word-line selection signal WL is changed to LOW. The transfer control signal blt1 is set to LOW to sever the bit lines BL and /BL from the sense amplifier.

After access through the column selection, the precharge signal brsx1 is changed to HIGH by the auto-precharge function, thereby precharging the bit lines BL and /BL. This results in the bit-line potentials bl and /bl being set to the potential vpr (=Vcc/2). Since the sense amplifier is disconnected from the bit lines, the sense amplifier is not reset. Until the next active signal act is supplied, the sense-amplifier driving signals lez and lex stay at HIGH and LOW, respectively, thereby maintaining the data of the sense amplifier. The active signal act is generated in response to the detection of a row address change, and indicates the start of an access operation with respect to a new row address.

In the above description, the operation has been described with reference to a case in which access is made to a memory cell connected to the bit lines BL and /BL. An operation will be the same even when access is made to a memory cell connected to the bit lines BL' and /BL'.

In the conventional DRAM core configuration, precharge circuits dedicated for bit lines are not provided while in the present invention such precharge circuits are provided by means of the NMOS transistors 37 through 39 and the NMOS transistors 40 through 42 as shown in FIG. 2. In the conventional configuration, the sense-amplifier driving signals lez and lex are changed to LOW and HIGH, respectively, to place the sense amplifier in an inactive state at timing A shown in FIG. 4 after column access. Then, the auto-precharge function is engaged at timing B to change the precharge signal brsx to HIGH, thereby precharging the sense amplifier portion and the bit lines BL and /BL simultaneously.

In this manner, the conventional configuration is designed to precharge the sense amplifier portion and the bit lines BL and /BL simultaneously after column access. The present invention, on the other hand, severs the bit lines BL and /BL from the sense amplifier portion after column access, and precharges only the bit lines BL and /BL at the memory cell portion through the auto-precharge function. At this time, the sense amplifier remains in the active state, and maintains the data stored therein until an active signal arrives to indicate the commencement of an access operation responsive to a row address transition. Accordingly, it suffices to read data stored in the sense amplifier without reactivating the word line when accessing a different column address on the same row address, thereby achieving high-speed data read operation. Further, when the sense amplifier is to be precharged in response to the active signal, the bit lines BL and /BL having a large parasitic capacitance have been already auto-precharged, so that it is sufficient to precharge only the sense amplifier portion in the inactive state. It is thus possible to carry out a high-speed precharge operation and promptly switch to a next read or write operation.

Figure 5:
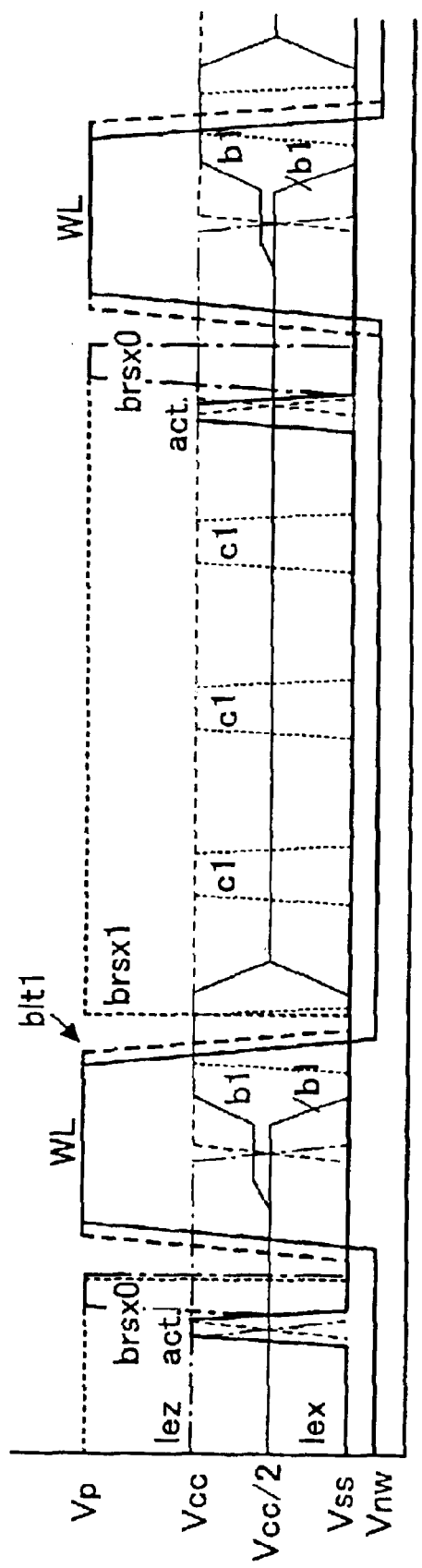
FIG. 5 is a signal time chart showing the operation of accessing different column addresses on the same row address according to the present invention.

FIG. 5 is a signal time chart showing the operation of accessing different column addresses on the same row address according to the present invention.

In FIG. 5, the word line is deactivated when the bit-line potentials bl and /bl are amplified by the sense amplifier, and, then, the sense amplifier is disconnected from the bit lines. Further, the precharge signal brsx1 is activated to carry out auto-precharge with respect to the bit lines BL and /BL. When column addresses are switched from the exterior of the device to access different memory cells connected to the same word line, column selection lines cl corresponding to the respective column addresses are successively activated in an asynchronous SRAM-like DRAM. Data corresponding to the activated column selection line cl is then read from the sense amplifier. In a synchronous SRAM-like DRAM, a column address is latched in synchronization with an external clock signal, and an internal address is progressively incremented in synchronization with this clock signal to generate successive addresses, thereby successively activating respective column selection lines cl. Data corresponding to the successively activated column selection line cl is then read from the sense amplifier. In this manner, the present invention achieves a page mode or a burst mode that provides high-speed data reading on the same row address. If an active signal act is activated in response to a row address change during the page mode operation, an operation as shown in FIG. 4 is performed to access a different row address.

Figure 6:
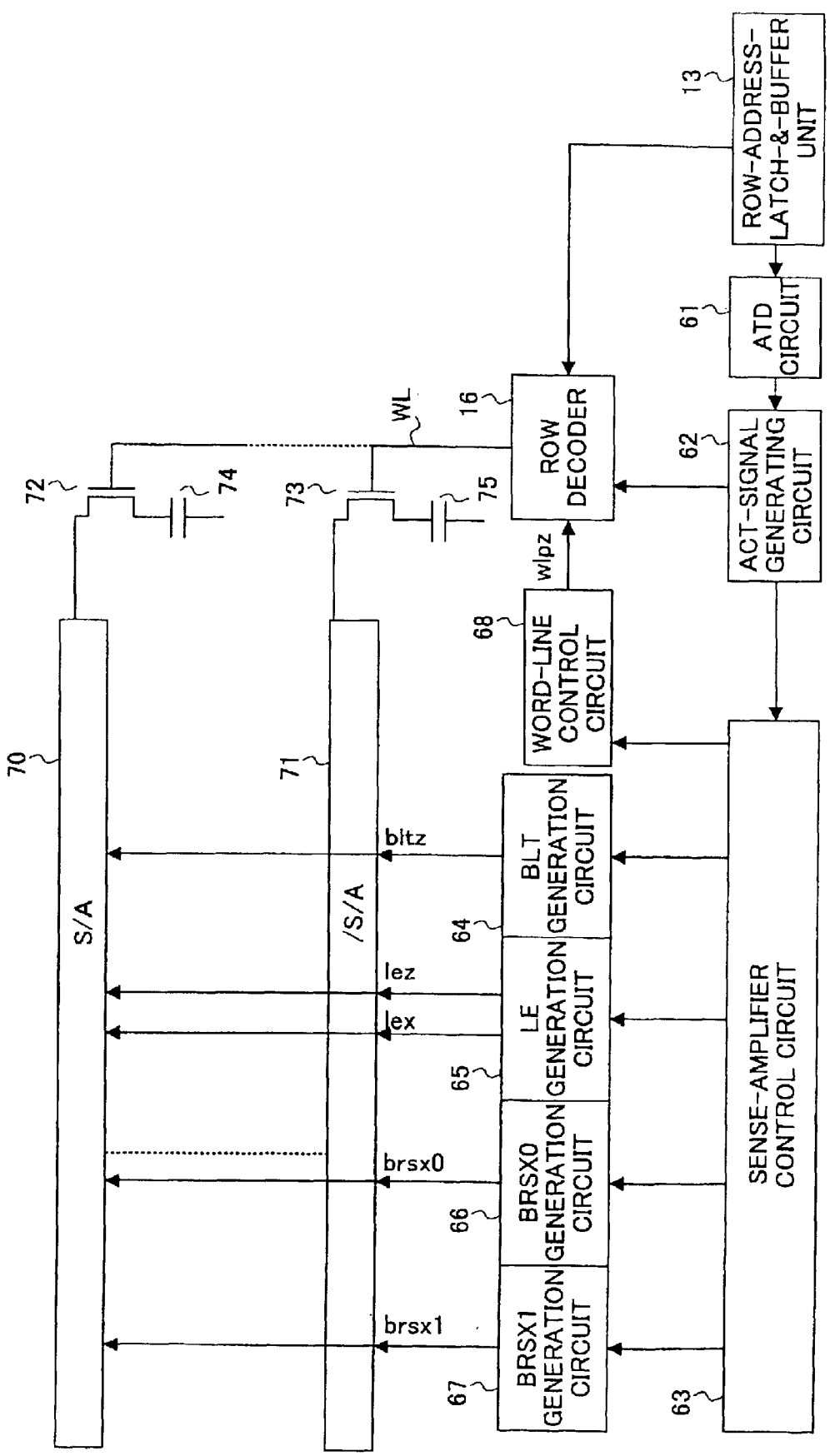
FIG. 6 is a block diagram showing a configuration for controlling a core operation.

FIG. 6 is a block diagram showing the configuration for controlling a core operation.

The circuit of FIG. 6 includes the row-address-latch-&-buffer unit 13, the row decoder 16, an ATD circuit 61, an act-signal generating circuit 62, a sense-amplifier control circuit 63, a blt generation circuit 64, an le generation circuit 65, a brsx0 generation circuit 66, a brsx1 generation circuit 67, a word-line control circuit 68, sense-amplifier circuits 70 and 71, NMOS transistors 72 and 73, and memory cells 74 and 75.

The ATD circuit 61 generates a pulse signal in response to a change of a row address supplied from the exterior of the device and stored in the row-address-latch-&-buffer unit 13. Based on the pulse signal, the act-signal generating circuit 62 generates the active signal act. The active signal act is then supplied to the row decoder 16 and the sense-amplifier control circuit 63. The sense-amplifier control circuit 63 generates various timing control signals by using the active signal act as an indication of the start timing, and supplies these timing signals to the blt generation circuit 64, the le generation circuit 65, the brsx0 generation circuit 66, the brsx1 generation circuit 67, and the word-line control circuit 68.

The blt generation circuit 64, the le generation circuit 65, the brsx0 generation circuit 66, and the brsx1 generation circuit 67 generate the transfer control signal bltz equivalent to blt1 and blt2, the sense-amplifier driving signals lez and lex, the precharge signal brsx0 for the sense amplifier portion, and the precharge signal brsx1 for the bit line portion, respectively. Moreover, the word-line control circuit 68 generates a signal wlpz for controlling the word-line activation timing, and supplies the signal wlpz to the row decoder 16. The sense-amplifier circuits 70 and 71 have a circuit configuration as shown in FIG. 2. When a word line WL is activated to make the NMOS transistors 72 and 73 conductive, the sense-amplifier circuits 70 and 71 will receive data of the memory cells 74 and 75 through respective bit lines.

Figure 7:
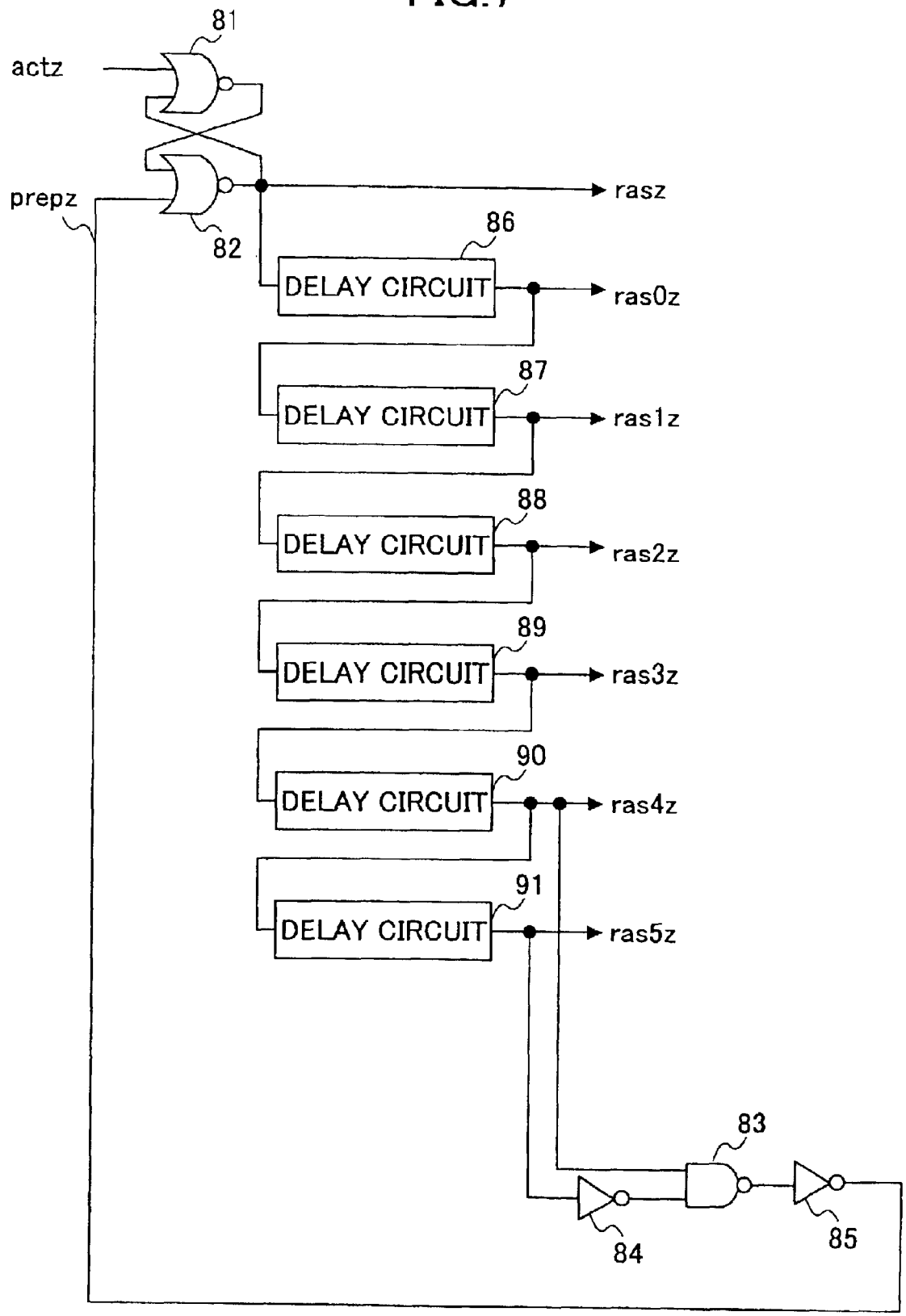
FIG. 7 is a circuit diagram showing the configuration of a sense-amplifier control circuit.

FIG. 7 is a circuit diagram showing the configuration of the sense-amplifier control circuit 63.

The sense-amplifier control circuit 63 of FIG. 7 includes NOR circuits 81 and 82, a NAND circuit 83, inverters 84 and 85, and delay circuits 86 through 91. The NOR circuits 81 and 82 together make up a RS flip-flop. This RS flip-flop is set by the signal act, and is reset by a signal prepz. When the RS flip-flop is set by the signal act, a timing signal rasz changes to HIGH, and the positive transition of this HIGH signal propagates through the delay circuits 86 through 91 one after another, thereby generating respective timing signals rasz, ras0z, ras1z, ras2z, ras3z, ras4z, and ras5z. Based on the timing signals ras4z and ras5z, the logic circuit that is comprised of the NAND circuit 83 and the inverters 84 and 85 generates the signal prepz, which is supplied to the RS flip-flop. With this provision, the RS flip-flop is reset at the timing at which the timing signal ras4z changes to HIGH.

Figure 8:
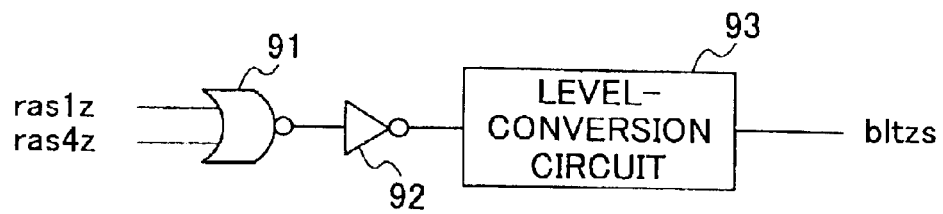
FIG. 8 is a circuit diagram showing an example of the configuration of a blt generation circuit.

FIG. 8 is a circuit diagram showing an example of the configuration of the blt generation circuit 64. The blt generation circuit 64 of FIG. 8 includes a NOR circuit 91, an inverter 92, and a level-conversion circuit 93. The blt generation circuit 64 receives the timing signals ras1z and ras4z generated by the sense-amplifier control circuit 63 of FIG. 7, and generates a signal which has a HIGH duration from the positive transition of ras1z to the negative transition of ras4z, followed by using the level-conversion circuit 93 to shift the HIGH level of the generated signal to the boosted potential Vp, thereby generating the transfer control signal bltz equivalent to blt1 and blt2.

Figure 9:
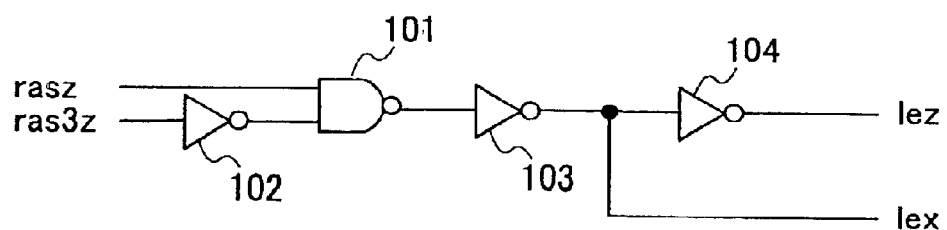
FIG. 9 is a circuit diagram showing an example of the configuration of an le generation circuit.

FIG. 9 is a circuit diagram showing an example of the configuration of the le generation circuit 65. The le generation circuit 65 of FIG. 9 includes a NAND circuit 101 and inverters 102 through 104. The le generation circuit 65 receives the timing signals rasz and ras3z generated by the sense-amplifier control circuit 63 of FIG. 7, and generates a signal which has a HIGH duration from the positive transition of rasz to the positive transition of ras3z. This generated signal is output as the sense-amplifier driving signal lex, and the inverse thereof is output as the sense-amplifier driving signal lez.

Figure 10:
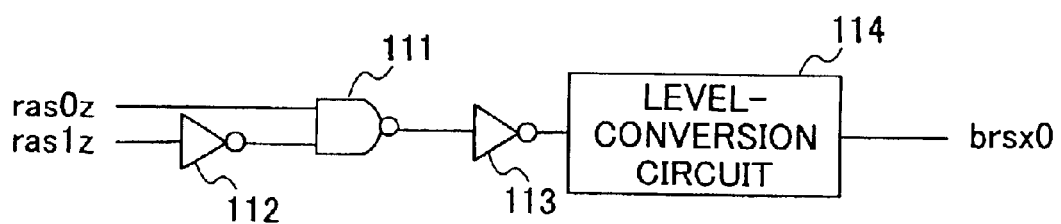
FIG. 10 is a circuit diagram showing an example of the configuration of a brsx0 generation circuit.

FIG. 10 is a circuit diagram showing an example of the configuration of the brsx0 generation circuit 66. The brsx0 generation circuit 66 of FIG. 10 includes a NAND circuit 111, inverters 112 and 113, and a level-conversion circuit 114. The brsx0 generation circuit 66 receives the timing signals ras0z and ras1z generated by the sense-amplifier control circuit 63 of FIG. 7, and generates a signal which has a HIGH duration from the positive transition of ras0z to the positive transition of ras1z, followed by using the level-conversion circuit 114 to shift the HIGH level of the generated signal to the boosted potential Vp, thereby generating the signal brsx0 for precharging the bit lines of the sense amplifier portion.

Figure 11:
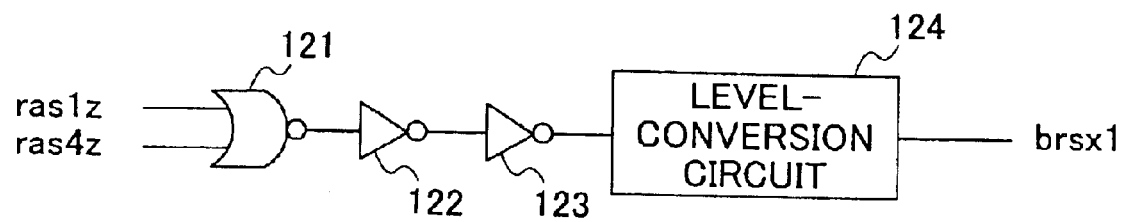
FIG. 11 is a circuit diagram showing an example of the configuration of a brsx1 generation circuit.

FIG. 11 is a circuit diagram showing an example of the configuration of the brsx1 generation circuit 67. The brsx1 generation circuit 67 of FIG. 11 includes a NOR circuit 121, inverters 122 and 123, and a level-conversion circuit 124. The brsx1 generation circuit 67 receives the timing signals ras1z and ras4z generated by the sense-amplifier control circuit 63 of FIG. 7, and generates a signal which has a LOW duration from the positive transition of ras1z to the negative transition of ras4z, followed by using the level-conversion circuit 124 to shift the HIGH level of the generated signal to the boosted potential Vp, thereby generating the signal brsx1 for precharging the bit lines connected to memory cells.

Figure 12:
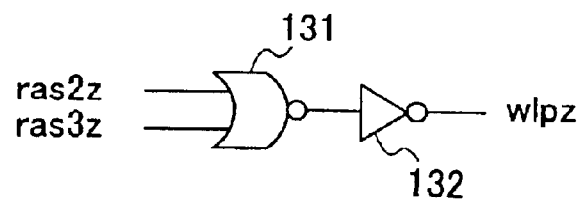
FIG. 12 is a circuit diagram showing an example of the configuration of a word-line control circuit.

FIG. 12 is a circuit diagram showing an example of the configuration of the word-line control circuit 68. The word-line control circuit 68 of FIG. 12 includes a NOR circuit 131 and an inverter 132. The word-line control circuit 68 receives the timing signals ras2z and ras3z generated by the sense-amplifier control circuit 63 of FIG. 7, and generates a signal which has a HIGH duration from the positive transition of ras2z to the negative transition of ras3z, thereby supplying the generated signal to the row decoder 16 as the signal wlp indicative of the timing of word-line activation.

Figure 13:
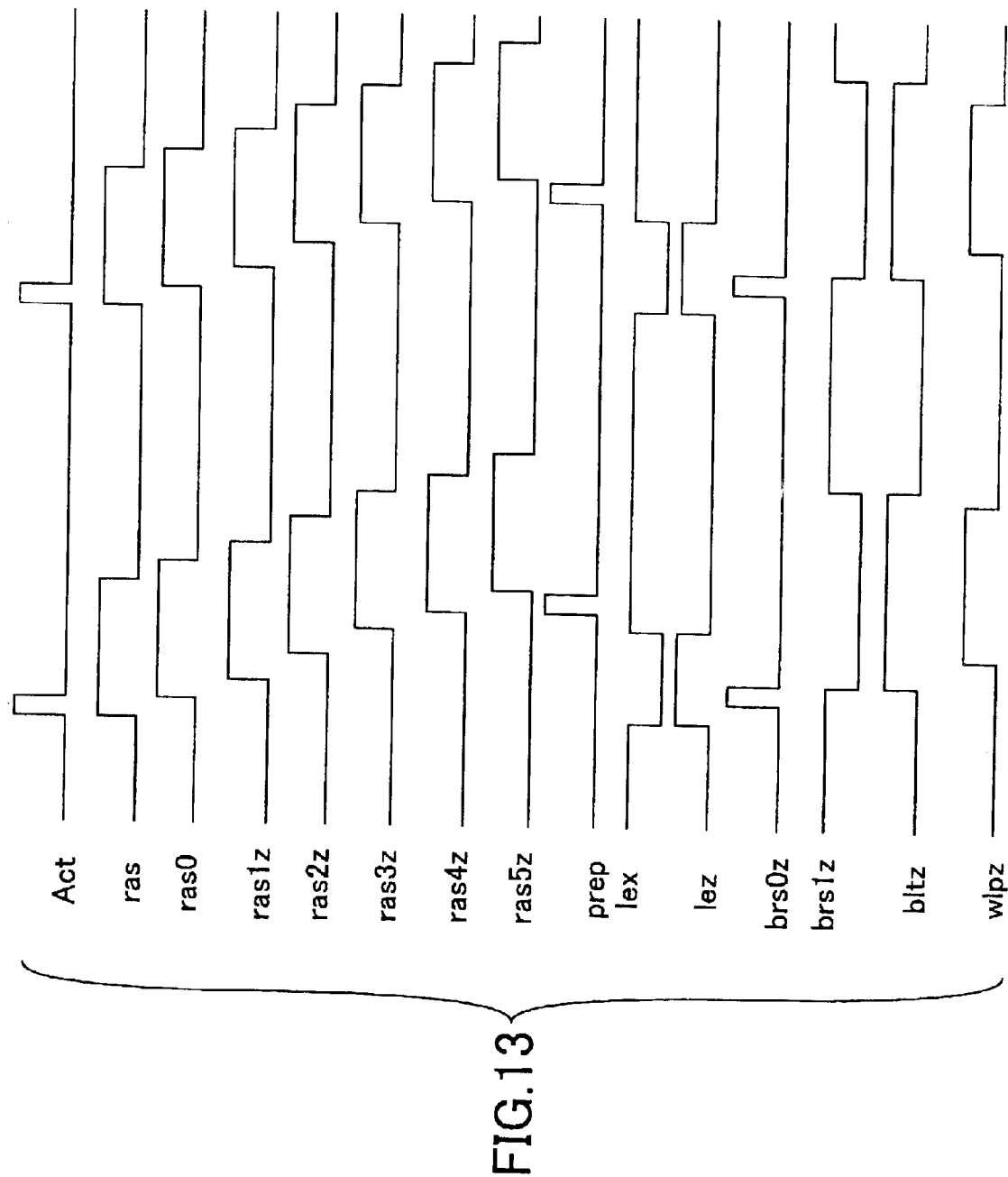
FIG. 13 is a timing chart showing timing signals generated by the sense-amplifier control circuit and other signals generated by signal generation circuits.

FIG. 13 is a timing chart showing the timing signals generated by the sense-amplifier control circuit 63 and other signals generated by the signal generation circuits responsive to these timing signals.

As shown in FIG. 13, the timing signals rasz, ras0z, ras1z, ras2z, ras3z, ras4z, and ras5z generated by the sense-amplifier control circuit 63 are successively changed to HIGH at the respective timings defined by the delays of the delay circuits, and thereafter maintain the HIGH level thereof for predetermined duration before returning to LOW. The signals prepz, lez, lex, brsx0, brsx1, bltz, and wlpz shown in the lower part of FIG. 13 are generated by using the positive transition or the negative transition of these timing signals. In the core operation, the bit lines of the sense amplifier portion are precharged in response to HIGH of the precharge signal brsx0, and the bit lines of a memory cell portion is then connected to the sense amplifier in response to HIGH of the transfer control signal bltz. Thereafter, a word line is activated in response to HIGH of the signal wlpz, and the data of the bit lines is then amplified by setting the sense-amplifier driving signals lez and lex to HIGH and LOW, respectively. After the signal wlpz is set to LOW to deactivate the word line, the bit lines of the memory cell portion are separated from the sense amplifier in response to LOW of the transfer control signal bltz. The bit lines of the memory cell portion are then precharged in response to HIGH of the precharge signal brsx1.

Through the operations responding to the signals as described above, the present invention keeps the data stored in the sense amplifiers even after the bit lines of the memory cell portion are precharged, until the active signal indicative of the commencement of an operation arrives in response to a row address transition. Where different column addresses on the same row address are to be accessed, therefore, the data stored in the sense amplifiers can be successively read without reactivating the word line, thereby achieving a high-speed data read operation.

Further, the present invention is not limited to these embodiments, but various variations and modifications may be made without departing from the scope of the present invention.

The present application is based on Japanese priority application No. 2002-031090 filed on Feb. 7, 2002, with the Japanese Patent Office, the entire contents of which are hereby incorporated by reference.

What is claimed is:

1. A semiconductor memory device, comprising:
   a first bit line connected to a memory cell via a transistor;
   a transfer gate;
   a second bit line connected to said first bit line via said transfer gate;
   a sense amplifier connected to said second bit line;
   a first precharge circuit for precharging said first bit line;
   a second precharge circuit for precharging said second bit line; and
   a control circuit which precharges said first bit line by said first precharge circuit after closing said transfer gate while maintaining data of said sense amplifier read from said memory cell, followed by subsequent precharging of said second bit line by said second precharge circuit.

2. The semiconductor memory device as claimed in claim 1, wherein said control circuit precharges said first bit line by said first precharge circuit a predetermined time after closing the transistor situated between said first bit line and the memory cell.

3. A semiconductor memory device comprising:
   a first bit line connected to a memory cell via a transistor;
   a transfer gate;
   a second bit line connected to said first bit line via said transfer gate;
   a sense amplifier connected to said second bit line;
   a first precharge circuit for precharging said first bit line;
   a second precharge circuit for precharging said second bit line;
   a control circuit which precharges said first bit line by said first precharge circuit after closing said transfer gate, followed by subsequent precharging of said second bit line by said second precharge circuit; and
   an address transition detection circuit which detects a transition of a row address externally supplied, wherein said control circuit precharges said second bit line by said second precharge circuit in response to a row address transition detected by said address transition detection circuit.

4. A semiconductor memory device, comprising:
   a first bit line connected to a memory cell via a transistor;
   a transfer gate;
   a second bit line connected to said first bit line via said transfer gate;
   a sense amplifier connected to said second bit line;
   a first precharge circuit for precharging said first bit line;
   a second precharge circuit for precharging said second bit line; and
   a control circuit which precharges said first bit line by said first precharge circuit after closing said transfer gate, followed by subsequent precharging of said second bit line by said second precharge circuit,
   wherein a plurality of data items are successively read from each said sense amplifier corresponding to an identical row address after said fist bit line is precharged by said first precharge circuit and before said second bit line is precharged by said second precharge circuit.

5. A method of precharging a semiconductor memory device, comprising the steps of:
   decoupling bit lines of a memory cell portion from bit lines of a sense amplifier portion;
   precharging the bit lines of the memory cell portion white maintaining data of sense amplifiers read from said memory cell portion;
   precharging the bit lines of the sense amplifier portion after precharging the bit lines of the memory cell portion;
   reading data from the sense amplifiers at different column addresses on an identical row address during a time period between the precharging of the bit lines of the memory cell portion and the precharging of the bit lines of the sense amplifier portion.

6. A method of precharging a semiconductor memory device, comprising the steps of:
   decoupling bit lines of a memory cell portion from bit lines of a sense amplifier portion;
   precharging the bit lines of the memory cell portion while maintaining data of sense amplifiers;
   precharging the bit lines of the sense amplifier portion after precharging the bit lines of the memory cell portion;
   reading data from the sense amplifiers at different column addresses on an identical row address during a time period between the precharging of the bit lines of the memory cell portion and the precharging of the bit lines of the sense amplifier portion,
   wherein the step of precharging the bit lines of the sense amplifier portion precharges the bit lines of the sense amplifier portion in response to detection of a transition of a row address externally provided.

7. A method of precharging a semiconductor memory device, comprising the steps of:
   decoupling bit lines of a memory cell portion from bit lines of a sense amplifier portion;
   precharging the bit lines of the memory cell portion while maintaining data of sense amplifiers;
   precharging the bit lines of the sense amplifier portion after precharging the bit lines of the memory cell portion;
   reading data from the sense amplifiers at different column addresses on an identical row address during a time period between the precharging of the bit lines of the memory cell portion and the precharging of the bit lines of the sense amplifier portion,
   wherein timing at which the bit lines of the memory cell portion are precharged is a fixed timing with reference to a core operation.

8. A semiconductor memory device, comprising:
   a circuit which precharges bit lines of a memory cell portion; and a circuit which precharges bit lines of a sense amplifier portion, wherein the bit lines of the memory cell portion and the bit lines of the sense amplifier portion are precharged independently of each other at different timings, and the bit lines of the memory cell portion are precharged while maintaining data on the bit lines of the sense amplifier portion read from said memory cell portion.

* * * * *